United States Patent
Zhu

(10) Patent No.: US 11,447,854 B2
(45) Date of Patent: Sep. 20, 2022

(54) PROCESS FOR FILM DEPOSITION ON A SUBSTRATE WITH NON-UNIFORM OVERLAPPING SUBPULSES OF A PRECURSOR

(71) Applicant: ASM IP Holding B.V., Almere (NL)

(72) Inventor: Chiyu Zhu, Almere (NL)

(73) Assignee: ASM IP HOLDING B.V., Almere (NL)

( * ) Notice: Subject to any disclaimer, the term of this patent is extended or adjusted under 35 U.S.C. 154(b) by 78 days.

(21) Appl. No.: 17/078,119

(22) Filed: Oct. 23, 2020

(65) Prior Publication Data
US 2021/0123128 A1     Apr. 29, 2021

Related U.S. Application Data

(60) Provisional application No. 62/925,787, filed on Oct. 25, 2019.

(51) Int. Cl.
| | | |
|---|---|---|
| C23C 14/54 | (2006.01) | |
| C23C 14/00 | (2006.01) | |
| C23C 14/34 | (2006.01) | |

(52) U.S. Cl.
CPC ...... C23C 14/0042 (2013.01); C23C 14/3485 (2013.01); C23C 14/542 (2013.01)

(58) Field of Classification Search
CPC .. C23C 14/042; C23C 14/3485; C23C 14/542
See application file for complete search history.

(56) References Cited

U.S. PATENT DOCUMENTS

| | | | | |
|---|---|---|---|---|
| 6,846,516 | B2 * | 1/2005 | Yang | ........... C23C 16/45561 427/255.393 |
| 7,396,565 | B2 * | 7/2008 | Yang | ........... C23C 16/45531 427/255.393 |
| 9,803,277 | B1 * | 10/2017 | Longrie | ........... H01L 21/76883 |
| 2001/0034123 | A1 * | 10/2001 | Jeon | ........... C23C 16/45527 257/E21.171 |
| 2005/0008779 | A1 * | 1/2005 | Yang | ........... C23C 16/45561 427/248.1 |
| 2012/0295449 | A1 * | 11/2012 | Fukazawa | ........... H01L 21/0228 438/786 |
| 2013/0203267 | A1 * | 8/2013 | Pomarede | ........... H01L 21/3142 438/778 |

(Continued)

OTHER PUBLICATIONS

Sperling, Brent A., et al., "In situ infrared spectroscopy during La2O3 ALD using La(iPrCp)3 and H2O". J. Vac. Sci. Technol. A 36(3) , May/Jun. 2018, 031513-1 to 031513-5.*

(Continued)

Primary Examiner — Bret P Chen
(74) Attorney, Agent, or Firm — Laine IP Oy; Mark W. Scott

(57) ABSTRACT

A process for the uniform controlled growth of materials on a substrate that directs a plurality of pulsed flows of a precursor into a reaction space of a reactor to deposit the thin film on the substrate. Each pulsed flow is a combination of a first pulsed subflow and a second pulsed subflow of the same precursor, wherein a pulse profile of the second pulsed subflow overlaps at least a portion of a latter half of a pulse profile of the first pulsed subflow having a non-uniform pulse profile.

13 Claims, 1 Drawing Sheet

(56) References Cited

U.S. PATENT DOCUMENTS

| | | | |
|---|---|---|---|
| 2015/0099066 A1* | 4/2015 | Huotari | C23C 16/45544 |
| | | | 427/255.28 |
| 2017/0358482 A1* | 12/2017 | Chen | H01L 21/28562 |
| 2019/0062911 A1* | 2/2019 | Sheedy | C23C 16/45527 |
| 2019/0088538 A1* | 3/2019 | Zierath | H01L 23/53209 |
| 2019/0291145 A1* | 9/2019 | Lee | C23C 16/50 |

OTHER PUBLICATIONS

Munoz-Rojas, David, et al., "Speeding up the unique assets of atomic layer deposition". Materials Today Chemistry, Elsevier, 2019, 12, pp. 96-120.*

Elers, Kai-Erik, et al., "Film Uniformity in Atomic Layer Deposition". Chemical Vapor Deposition, 2006, 12, 13-24.*

Gusev, E.P., et al., "Uniform HfO2 films grown on silicon by atomic layer deposition for advance gate dielectrics applications". Microelectronic Engineering, 69 (2003) 145-151.*

* cited by examiner

PROCESS FOR FILM DEPOSITION ON A SUBSTRATE WITH NON-UNIFORM OVERLAPPING SUBPULSES OF A PRECURSOR

FIELD

The present invention relates to the controlled growth of materials on a substrate, and in particular to apparatus and processes for the uniform and rapid controlled growth of materials on a substrate during a film deposition process.

BACKGROUND

Thin film deposition is used to build materials by growing materials on a substrate. The resulting substrates have widespread usage in microelectronics, as well as in other fields. Two well-known thin film deposition techniques are atomic layer deposition (ALD) and Chemical Vapor Deposition (CVD). In each technique, one or more reactants (precursors), typically in the form of gases, are fed into a reactor, which repeatedly grow a desired film or layer on the substrate. During normal operation of ALD, the precursor is pulsed into the reactor, and each precursor pulse reacts with a finite number of reactive sites on the available surface. Once all the reactive sites are consumed, growth stops. The remaining precursor molecules in the reactor are flushed away with a purge gas and then the next precursor is delivered to the reactor. By alternatingly introducing a first and a second precursor, a thin film is deposited on the substrate. When describing an ALD process, one refers to both dose times (the time a surface is exposed to a precursor) and purge times (the time left between doses for the precursor to evacuate the reactor) for each precursor. The dose-purge-dose-purge sequence of a binary ALD process constitutes an ALD cycle.

Within an ALD process, it is known that the pulse profile of a precursor has an influence on the resulting layer. Pulse profile refers to the amount of reactant delivered per unit time for a duration of the pulse. The amount of reactant delivered within each pulse may be a function of flow velocity or/and of concentration; that is, the amount of precursor may be dependent on the volumetric flow rate and/or a concentration of the precursor in the carrier gas (if a carrier gas is used). In known methods, the flow rate of precursor being constant, the pulse profile typically shows a high concentration spike at the leading edge of the pulse and the concentration then tails off. This leads to non-uniformity in the film of the substrate, namely the layer generated by each pulse tends to be thicker at a leading edge and thinner at a trailing edge thereof. Accordingly, processes which provide for a more uniform film deposition thickness in thin film processes, such as ALD, are desired.

SUMMARY

In accordance with an aspect of the present invention, the present inventors have developed apparatus and processes for the uniform and rapid controlled growth of thin films on a substrate. In one aspect, there is provided method of depositing a thin film on a substrate comprising: directing a plurality of pulsed flows of a precursor into a reaction space of a reactor to deposit the thin film on the substrate, each pulsed flow comprising a combination of a first pulse subflow and a second pulse subflow, wherein a pulse profile of the second pulse subflow overlaps at least a portion of a latter half of a pulse profile of the first pulse subflow. By providing a more uniform distribution throughout the pulse profile and a greater amount of precursor toward a trailing end of the pulsed flow relative to known methods, a more uniform thin film deposit is provided.

In accordance with another aspect, there is provided a system for depositing a thin film on a substrate comprising:
a reactor defining a reaction space therein;
a first path and a second path in fluid communication with the reactor and the reaction space, wherein the first path and the second path intersect prior to the reactor;
at least one precursor source in fluid communication with the first path and the second path for delivering a precursor there through;
a controller configured to control of a flow of the precursor through each of the first and second paths to direct a plurality of pulsed flows of the precursor to the reaction space, wherein each pulsed flow comprises a combination of a first pulsed subflow and a second pulsed subflow flowing through the first path and the second path, respectively;
wherein a pulse profile of the second pulsed subflow overlaps at least a portion of a latter half of a pulse profile of the first pulsed subflow.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION

Although certain embodiments and examples are disclosed below, it will be understood by those in the art that aspects of the present invention extend beyond the specifically disclosed embodiments and/or uses of the invention and obvious modifications and equivalents thereof. Thus, it is intended that the scope of the invention disclosed should not be limited by the particular disclosed embodiments described below. Different applications of thin film technology have different quality and output requirements for their associated materials. A system which is capable of growing thin films according to specific needs of a certain application is desirable. It is also desirable to create such a system which involves the least amount of modification from current systems as possible to be able to employ already existing components.

Figure 1:
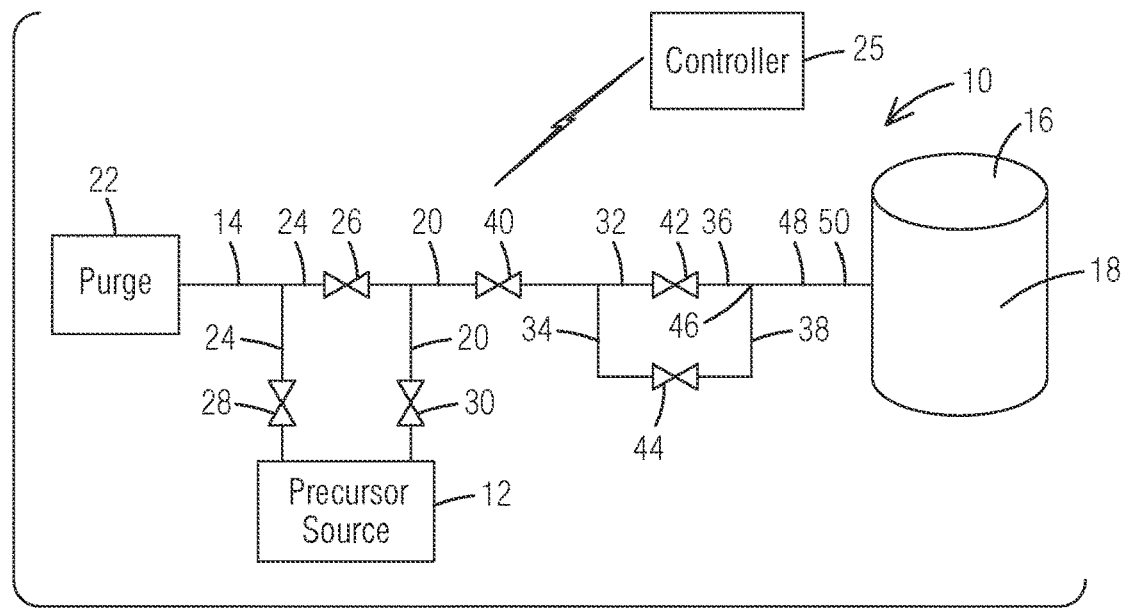
FIG. 1 is a schematic view of components of a system for depositing a thin film on a substrate in accordance with an aspect of the present invention.

FIG. 1 illustrates a system 10 for carrying out a thin film deposition process in accordance with an aspect of the present invention. The system 10 comprises a precursor source 12, a feed path 14, and a reactor 16 which defines a reaction space 18 therein for depositing a thin film on a substrate (not shown) disposed within the reaction space 18. An amount of a precursor 20 is initially delivered from the source 12 into the feed path 14, and ultimately to the reaction space 18 as will be explained below. One or more controllers 25 are also provided in the system 10 and are in electrical communication with one or more sensor, valves, or the like associated with the fluid paths, e.g., paths 14, 32, 34, 50, in the system 10 for controlling delivery of the precursor 20 or any other gas to the reactor 16.

In addition, in certain embodiments, the system 10 may include a purge gas source 22 in fluid communication with the feed path 14 for delivering a purge gas 24 as needed to the reaction space 18. By "fluid communication" as used herein, it is meant that the fluid, e.g., gas, directly or indirectly flows from a first location to a second location with or without combination with any other components. Thus, when A is in fluid connection with B, for example, it is meant that a flow of a gas flows from A and reaches B, and may or may not be combined with any other gases. In certain embodiments, the purge gas 24 may also be diverted to the precursor source 12 as a carrier gas for the precursor 20 prior to delivery of the precursor 20 to the reactor 18. Control of the delivery of carrier/purge gas 24 may be accomplished via controller 25 and valves 26, 28 as shown. Delivery of precursor 20 from the precursor source 12 to feed path 14 may initially be accomplished through controller 25 and one or more valves, e.g., valve 30, as shown.

Still referring to FIG. 1, the flow of the precursor 20 from the precursor source 12 is split into two or more subflows (a first pulsed subflow and a second flow subflow) which are then combined prior to entry into the reactor 16. To accomplish this, feed path 14 may be split into two paths to define a first path 32 and a second path 34, each of which is a continuation of feed path 14. A first pulsed subflow 36 flows through the first path 32 and a second pulsed subflow 38 flows through the second path 34. By "first" and "second" with respect to the first and second subflows 36, 38, it is meant the order that the subflows 36, 38 enter the reactor 16 such that the first pulsed subflow 36 enters the reactor 16 before the second pulsed subflow 38. Put another way, in the (combined) pulsed flow 48 discussed below, the first pulsed subflow 36 constitutes a first portion of the (combined) pulsed flow 48 and the second pulsed subflow 38 constitutes a second (downstream or tailing end portion) of the (combined) pulsed flow.

One or more valves, e.g., valves 40, 42 as shown, may be associated with the feed path 14 and/or first path 32 to allow for opening, closure, and/or restriction of flow of the precursor 20 through the first path 32. In addition, the second path 34 may include one or more valves, e.g., valve 44, for opening, closure, and/or restriction of the flow of precursor 20 through the second path 34. In an embodiment, any one or more valves as described herein may comprise a mass flow controller which houses the respective valve(s) and is associated with a respective path, e.g., paths 14, 32, 34, and/or 50.

From the precursor source 20, the flows of precursor 20 through the first path 32 and the second path 34 meet at intersection 46 and deliver a (combined) pulse flow 48 via path 50 to the reaction space 18 of the reactor 16. As will be discussed below, each of the first pulsed subflow 36 and second pulsed subflow 38 comprise a pulse profile (amount of reactant per unit time), and thus the combined pulse flow 48 comprises a (combined) pulse profile 58 that is a sum of the pulse profiles of the first and second pulsed subflows 36, 38.

It is appreciated that FIG. 1 is illustrative of a system for controlling a pulse profile for a plurality of pulsed flows of a single precursor reactant. It is appreciated, however, that more than one precursor may be provided in the system 10, and the system 10 may thus include additional precursor sources 12 that may feed into feed path 14. In addition, while the first and second pulsed subflows 36, 38 are illustrated as being derived from a single precursor source 12, it is appreciated also that the systems and processes described herein are also not so limited. In certain embodiments, more than one precursor source may be provided, such as a first precursor source to supply precursor for the first pulsed subflow 36 and a second precursor source (independent of the first precursor source) to supply precursor for the second pulsed subflow 38. As such, it is appreciated any of the components of the system 10 illustrated may be duplicated as needed for providing additional precursors to the reactor 16.

The precursor 20 utilized in the system 10 may comprise any one or more suitable precursors for forming the desired thin film on the substrate. In an embodiment, the precursor 20 comprises a transition metal. Exemplary transition metals, specifically transition metal halides, which may be utilized include $TiCl_4$, $WF_6$, $TaCl_5$, $TaF_5$, $MoCl5$, $MoF_x$, $ZrCl_4$, or $HfCl_4$. In an embodiment, one or more of the precursors 20 may also or instead comprise silicon, which may comprise a silicon halide, for example $SiCl_4$, or a silicon compound with organic ligands, which may comprise an aminoligand, for example bis(dimethylamino)silane, bis(diethylamino)silane, bis(ethylmethylamino)silane, diisopropylaminosilane, and/or hexakis(ethylamino)disilane.

In another embodiment, one or more of the precursors 20 may also or instead comprise organometallic species, for example, precursor(s) comprising cyclopentadienyl or an alkyl ligand, such as a methyl ligand. In another embodiment, one or more of the precursors 20 may also or instead comprise a metalorganic ligand, such as an alkylamine ligand, for example, a titanium, hafnium or zirconium alkylamide precursor. In addition, other precursors 20 which may be utilized with the aforementioned transition metals may include $NH_3$, H2, $H_2O$, $H_2O_2$, $O_2$ and $O_3$. Still further, plasmas, atomic or excited species and radicals containing nitrogen, oxygen or hydrogen species may also be used as a precursor 20, for example, created from gases mentioned above. In addition to the precursor described, there may be additional gases utilized in the process, for example, inert gases such as $N_2$, He or Ar. By way of example only, in a particular embodiment, the precursor 20 may comprise ammonia and titanium chloride, which are separately provided to the reactor 16 to form a deposition of titanium nitride on a substrate. In other embodiments, trimethylaluminum (TMA) may be used in combination with other suitable precursor(s) for the deposition of alumina on a substrate.

Additionally, it is appreciated that between selected ones of the combined pulsed flows 48, any remaining precursor 20 in the reaction space 18 may be removed therefrom by introducing a purge gas 24 from the purge gas source 22 into the reaction space 18. In certain embodiments, the purge gas 24 is introduced into the reaction space 18 after each combined pulsed flow 48 is introduced into the reaction space 18. The length of the purge (cycle) may be any amount of time to effectively remove the subject precursor material from the reaction space 18. In an embodiment, the purging is done for a time period of greater than 0.1 second but less than approximately 5.0 seconds, or greater than 0.1 second but less than approximately 3.0 seconds, or even greater than 0.1 second but less than approximately 2.0 seconds. The purge gas 24 may comprise any suitable gas, such as nitrogen, or the like.

Figure 2:
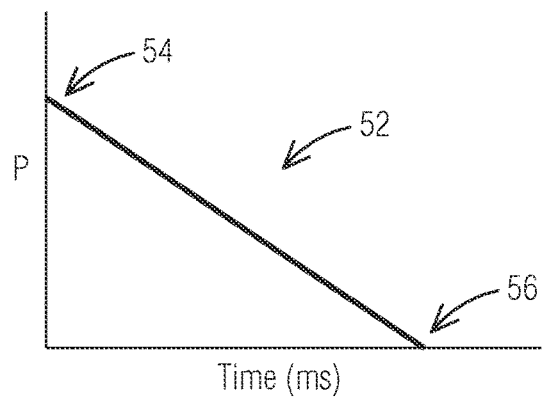
FIG. 2 illustrates a pulse profile of a normal pulsed flow utilized in thin film deposition.

In accordance with an aspect of the present invention, a pulse profile for each individual (combined) pulsed flow 48 is controlled so as to result in a more uniform deposition of material by a thin film deposition process, e.g., ALD, relative to known methods. Referring now to FIG. 2, there is shown a normal pulsed profile. As shown, in the normal pulsed profile 52, an amount of precursor comprises a maximum at a right leading (front) edge 54 of the profile 52; thereafter, the amount of precursor tails off towards a trailing edge 56 thereof. In FIG. 2, the x-axis represents a duration of the pulsed flow and the y-axis represents an amount, e.g., partial pressure, of the pulse flow.

To explain further, the profile shape shown in FIG. 2 may arise in ALD processes which utilize precursors having a substantial vapor pressure at room temperature, such as TMA or $H_2O$. Also, in processes with relatively short purge times, the partial pressure peak shown in FIG. 2 often appears immediately after opening the valve(s) which supply the precursor. These high partial pressure precursor pulses as shown in FIG. 2 can cause undesirable particle formation and non-uniform parasitic film growth, as well as uneven deposition on the substrate. Through modification of the partial pressure of the precursor supplied over time as described by the apparatus and processes described herein, improved control over partial pressures of precursor within the reaction space can be achieved and more uniform thin film depositions can be provided.

To overcome the deficiencies of systems and processes which incorporate pulsed flows having a profile as shown in FIG. 2, the apparatus and processes described herein provide a combined pulsed flow from a first pulsed subflow and a second pulsed subflow, each having a pulse profile (amount of precursor (y-axis) per unit time (x-axis)) as set forth herein. In an embodiment, the amount of precursor for each pulse profile 58, 60, 62 is provided as a partial pressure of the precursor 20. In contrast to the profile for a pulsed flow in FIG. 2, aspects of the present invention deliver a pulsed flow having a profile which results in a substantially more uniform distribution of material in a thin film deposition process, such as an ALD process.

Figure 3:
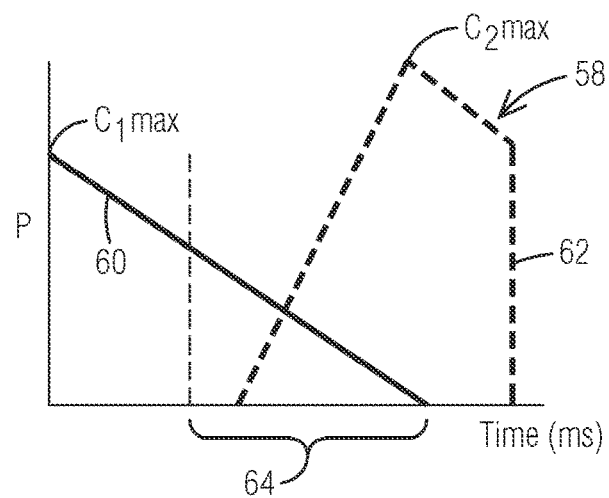
FIG. 3 illustrates a pulse profile of a pulsed flow utilized in thin film deposition in accordance with an aspect of the present invention.

As shown in FIG. 3, for example, a pulse profile 58 for the (combined) pulsed flow 48 is provided which comprises a combination of a pulse profile 60 for the first pulsed subflow 36 and a pulse profile 62 for the second pulsed subflow 38. In the (combined) profile 58, the pulse profile 62 for the second pulsed subflow 38 overlaps at least a portion of a latter half 64 of the pulse profile 60 of the first pulsed subflow 36. In this way, for each (combined) pulsed flow 48, a concentration of the precursor 20 is increased towards a tailing edge 56 of the (combined) profile 58 relative to the normal pulsed profile 52 shown in FIG. 2. It is appreciated that multiple profile shapes are possible for pulse profile 58 fitting these parameters; accordingly, it is understood that the pulse profile 58 is not limited to the shape depicted in FIG. 3.

In particular embodiments, as is also shown in FIG. 3, a maximum (maximum amount), e.g., $C_2$max, in the pulse profile 62 of the second pulsed subflow 38 is greater than a maximum (maximum amount), e.g., $C_1$max, in the pulse profile 60 of first pulsed subflow 36, although it is understood that the present invention is not so limited. In an embodiment, the maximum ($C_2$max) of the precursor in the pulse profile 62 of the second pulsed subflow 38 is at least 10% greater, and in certain embodiments 20% greater, than the maximum ($C_1$max) in the pulse profile 60 of first pulsed subflow 36. In other embodiments, the first pulsed subflow 36 may comprise a greater maximum ($C_1$max) than the second pulsed subflow 38 ($C_2$max). In either case (a greater maximum in the first or second subflow), by combining the subflows 36, 38, a concentration of the precursor 20 is advantageously increased towards a tailing edge 56 of the (combined) profile 58 relative to a typical pulsed profile 52 shown in FIG. 2.

In accordance with an aspect, the pulse profile 58 as described herein may be formed by any suitable process which produces the desired profile shape. It is appreciated that to achieve the desired shape of combined profile 58, the second pulsed subflow 38 arrives at the intersection 46 at a later moment in time relative to the first pulsed subflow 36 so as to able to achieve the combined flow 48 and combined profile 58. To accomplish this objective, in an embodiment, the first pulsed subflow 36 is delivered through the first path 32 and the second pulsed subflow 38 is delivered through the second path 34 toward the reaction space 18, wherein a conductance of the first path 32 and the second path 34 are different. This conductance difference can be achieved by any suitable structure or process, including but not limited to: by adjustment of a flow rate (based on mass or volume) of the first pulsed subflow 34 and/or second pulsed subflow 36 via the controller 25, valves 26, 28, 30, 40, 42, 44, or the like; by providing differing path lengths for the first path 32 and the second path 34; by providing different cross-sections between for the first path 32 and the second path 34; and/or by any other suitable method or structure.

In addition, to achieve a combined profile 58 as described herein, in certain embodiments, a greater amount of the precursor 20 is present in the second pulsed subflow 38 relative to the first pulsed subflow 38. This effect may also be achieved by any suitable structure or process. For example, in an embodiment, the second pulsed subflow 38 is delivered to the reaction space 18 at a greater mass flow rate than that of the first pulsed subflow 36. In other embodiments, the mass flow rate may be identical or substantially similar (5% or less difference) and the pulse profile 62 of the second pulsed subflow 38 is provided by delivering a greater amount of the precursor 20 in the second pulsed subflow 38 per unit time relative to the first pulsed subflow 36.

In accordance with an aspect, the pulse profile 60 of first pulsed subflow 36 and the pulse profile 62 of the second pulsed subflow 38 may be of any suitable duration. In an embodiment, the second pulsed subflow 38 is provided for a shorter duration (within a shorter period of time) relative to the first pulsed subflow 36, and thus the pulse profile 62 of the second pulsed subflow 38 may be shorter than the pulse profile 60 of the first pulsed subflow 36. In a particular embodiment, the first profile 60 may have a duration of 10 ms to 10,000 ms and the pulse profile 62 may have a duration of 10 ms to 10,000 ms. Thus, in an embodiment, the combined pulse profile 58 may have a total duration of 10 ms to 10,000 ms. The (concentration) maxima $C_1$max and $C_2$max referenced above are separated by a time interval $\Delta t$ defined as t2 -t1. In an embodiment, $\Delta t$ of t2 -t1 may be 10 ms to 1000 ms, 10 ms to 200 ms, 10 ms to 100 ms, or in certain embodiments, 10 ms to 50 ms.

In accordance with another aspect, in certain embodiments, each pulsed subflow 36, 38 may be further controlled such that 50% or less of a total amount (e.g., partial pressure) of precursor 20 in one pulsed subflow 36, 38 is introduced to the reaction space 18 during a first half of the pulsed subflow duration. According to further embodiments, each pulsed subflow 36, 38 is controlled such that less than 30%, less than 25%, and even less than 20% of a total amount (e.g., partial pressure) of the precursor 20 in selected subflows 36, 38 is introduced to the reaction space 18 during a first half of the pulse subflow duration.

The controller 25 for controlling flow of the precursor 20 or any other parameter affecting the (combined) pulse profile 58 may comprise any suitable computing device comprising at least microprocessor and a memory specially programmed for carrying out any step in the processes as described herein. It is appreciated, in certain embodiments, more than one controller 25 may be provided. The controller 25 may be in (wired or wireless) communication with any of the components of the system 10 for controlling a pressure and/or flow of the precursor 20 and/or purge gas 24, such as valves 26, 28, 40, 40, 42, 44 or the like provided on any of the paths 14, 32, 34, 50 described herein. In this way, the controller 25 may open, close, or restrict any of the valves described herein to control the timing and amount of precursor 20 delivered to the reaction space 12 and shape of the (combined) pulse profile 58. In certain embodiments, as also mentioned above, any the valves on the paths as described herein may comprise a mass flow controller (MFC), which are associated with the relevant path, are in wired or wireless communication with the controller, and assist the controller 25 in controlling a mass or volumetric flow rate in a desired manner accurately. The MFC can be controlled by the controller 25 such the desired pulse profile can be achieved, programmed, pre-programmed and/or controlled.

It is appreciated that in the systems and processes described herein, the feed lines, valves, and components other than the reactor 18 and precursor source 12 are not limited. It is appreciated that one or more inlets, feed lines (pathways), outlets, pumps, valves, flow sensors, pressure sensors, concentration centers, or computing devices (comprising a microprocessor, an input, an output, and a memory), or the like may be included in any of the embodiments described herein for facilitating the introduction, output, timing, volume, selection, and direction of flows of any of the materials, precursor 20 and/or purge gas 24, therein.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

PARTS LIST 10 system
12 precursor source
14 feed line
16 16 reactor
18 reaction space
20 precursor
22 purge gas source
24 purge gas
25 controller
26 valve
28 valve
30 valve
32 first path
34 second path
36 first pulsed subflow
38 second pulsed subflow
40 valve
42 valve
44 valve
46 intersection
48 combined flow
50 combined path
52 normal pulsed profile
54 leading edge
56 trailing edge
58 combined profile
60 pulse profile
62 pulse profile
64 latter half

The invention claimed is:

1. A method of depositing a thin film on a substrate comprising:
   directing a plurality of pulsed flows of a precursor into a reaction space of a reactor to deposit the thin film on the substrate, each pulsed flow comprising a combination of a first pulsed subflow and a second pulsed subflow of the same precursor, wherein a pulse profile of the second pulsed subflow overlaps at least a portion of a latter half of a pulse profile of the first pulsed subflow to form a combined pulsed flow having a non-uniform pulse profile.

2. The method of claim 1, wherein the directing comprises delivering the second pulsed subflow to the reaction space at a greater mass flow rate than that of the first pulsed subflow.

3. The method of claim 2, wherein the second pulsed subflow is provided within a shorter period of time relative to the first pulsed subflow.

4. The method of claim 1, wherein the directing comprises delivering a greater amount of the precursor in the second pulsed subflow per unit time than in the first pulsed subflow.

5. The method of claim 1, wherein the directing is done by delivering the first pulsed subflow through a first path and the second pulsed subflow through a second path to the reaction space, wherein a conductance of the first path and the second path are different.

6. The method of claim 5, wherein the difference in conductance is provided by a difference in path length, a degree of flow restriction, or a cross sectional length between the first path and the second path.

7. The method of claim 1, wherein the first path and the second path are in fluid communication with a common reactant source for the first pulsed subflow and the second pulsed subflow, and wherein the first path and the second path intersect prior to the reaction space to deliver each pulsed flow to the reaction space.

8. The method of claim 1, wherein a maximum in the pulse profile of the second pulsed subflow is greater than a maximum in the pulse profile of first pulsed subflow.

9. The method of claim 8, wherein a time difference between the maximum in the pulse profile of the first pulsed subflow and the maximum in the pulse profile of the second pulsed subflow is from 10 ms to 1000 ms.

10. The method of claim 8, wherein the maximum in the pulse profile of the second pulsed subflow is at least 10% greater than the maximum of the precursor in the pulse profile of first pulsed subflow.

11. The method of claim 1, further comprising delivering a purge gas to the reaction space between selected ones of the plurality of pulsed flows.

12. The method according to claim 1, wherein 50% or less of a total amount of the precursor in the each of the first pulsed subflow and the second pulsed subflow is introduced to the reaction space during a first half of the duration of the first pulsed subflow and the second pulsed subflow, respectively.

13. The method according to claim 1, wherein at least a portion of the pulse profile of the second pulsed subflow does not overlap with the pulse profile of the first pulsed subflow.

* * * * *